(12) United States Patent
Sato et al.

(10) Patent No.: US 7,704,414 B2
(45) Date of Patent: Apr. 27, 2010

(54) IMAGE-FORMING METHOD EMPLOYING A COMPOSITION

(75) Inventors: Koichi Sato, Atsugi (JP); Tomoko Maruyama, Atsugi (JP); Ikuo Nakazawa, Kawasaki (JP); Ryuji Higashi, Kawasaki (JP); Sakae Suda, Yokohama (JP); Masayuki Ikegami, Atsugi (JP); Keiichiro Tsubaki, Kawasaki (JP); Keiko Yamagishi, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 704 days.

(21) Appl. No.: 10/557,258

(22) PCT Filed: May 2, 2005

(86) PCT No.: PCT/JP2005/008647

§ 371 (c)(1),
(2), (4) Date: Nov. 16, 2005

(87) PCT Pub. No.: WO2005/108507

PCT Pub. Date: Nov. 17, 2005

(65) Prior Publication Data

US 2007/0069183 A1 Mar. 29, 2007

(30) Foreign Application Priority Data

| May 7, 2004 | (JP) | ............................. 2004-139050 |
| May 7, 2004 | (JP) | ............................. 2004-139051 |
| Feb. 10, 2005 | (JP) | ............................. 2005-034989 |

(51) Int. Cl.
*H01B 1/00* (2006.01)

(52) U.S. Cl. .................. 252/500; 106/31.13; 106/31.6; 257/40; 347/100; 430/350; 430/394; 430/495.1; 430/905; 516/33; 516/88; 523/160

(58) Field of Classification Search ................. 252/500; 106/31.6, 31.13; 347/100; 524/388; 516/88, 516/33; 523/160; 257/40; 430/350, 394, 430/495, 905
See application file for complete search history.

(56) References Cited

U.S. PATENT DOCUMENTS 5,085,698 A * 2/1992 Ma et al. ..................... 524/388

(Continued)

FOREIGN PATENT DOCUMENTS

EP 0 703 087 A2 3/1996

(Continued)

OTHER PUBLICATIONS

Shikizai Colorants, vol. 75, No. 2 (Feb. 2002), pp. 66-70.

(Continued)

*Primary Examiner*—Mark Kopec
*Assistant Examiner*—Khanh Tuan Nguyen
(74) *Attorney, Agent, or Firm*—Fitzpatrick, Cella, Harper & Scinto (57) ABSTRACT

A composition comprises a solvent, and an electroconductive substance and an amphiphilic block copolymers having a polyalkenyl ether repeating-unit structure, or a block copolymer enclosing an electroconductive substance. A black ink composition comprises a fine particulate metal having an average particle diameter of not more than 20 nm, an amphiphilic block copolymer, and a solvent. A method for forming an electroconductive pattern by applying the composition. A method for forming an electroconductive pattern by applying a composition comprises a block copolymer enclosing an electroconductive substance, system to form an electroconductive pattern on the substrate.

3 Claims, 2 Drawing Sheets

U.S. PATENT DOCUMENTS

| | | | |
|---|---|---|---|
| 5,114,477 A * | 5/1992 | Mort et al. | 106/31.6 |
| 5,849,219 A * | 12/1998 | De Laat et al. | 516/88 |
| 7,004,579 B2 | 2/2006 | Sato et al. | 347/105 |
| 7,029,841 B2 | 4/2006 | Fukushima et al. | 435/6 |
| 7,056,972 B2 | 6/2006 | Nakazawa et al. | 524/505 |
| 7,067,590 B2 | 6/2006 | Sato et al. | 525/299 |
| 7,151,156 B2 | 12/2006 | Sato et al. | 528/86 |
| 2002/0012748 A1 | 1/2002 | Hasegawa | 427/256 |
| 2002/0186288 A1* | 12/2002 | Nakazawa et al. | 347/100 |
| 2003/0032053 A1 | 2/2003 | Fukushima et al. | 435/7.1 |
| 2003/0047729 A1* | 3/2003 | Hirai et al. | 257/40 |
| 2003/0050364 A1* | 3/2003 | Sato et al. | 523/160 |
| 2003/0110978 A1* | 6/2003 | Abe et al. | 106/31.13 |
| 2005/0131102 A1 | 6/2005 | Nakazawa et al. | 523/160 |
| 2005/0140762 A1 | 6/2005 | Sato et al. | 347/100 |
| 2005/0197424 A1 | 9/2005 | Higashi et al. | 523/160 |
| 2005/0209367 A1 | 9/2005 | Sato et al. | 523/161 |
| 2005/0219277 A1 | 10/2005 | Sato et al. | 347/1 |
| 2005/0239918 A1 | 10/2005 | Nakazawa et al. | 523/160 |
| 2005/0249925 A1 | 11/2005 | Ikegami et al. | 428/195.1 |
| 2006/0004124 A1 | 1/2006 | Tsubaki et al. | 523/160 |
| 2006/0047015 A1 | 3/2006 | Duda et al. | 523/160 |
| 2006/0050117 A1 | 3/2006 | Sato et al. | 347/100 |
| 2006/0057485 A1 | 3/2006 | Teshima et al. | 430/108.8 |
| 2006/0100310 A1 | 5/2006 | Nakazawa et al. | 523/160 |
| 2006/0128828 A1 | 6/2006 | Sato et al. | 523/160 |
| 2006/0144287 A1 | 7/2006 | Tsubaki et al. | 106/31.13 |
| 2006/0146098 A1 | 7/2006 | Young et al. | 347/21 |
| 2006/0148997 A1 | 7/2006 | Sato et al. | 525/299 |
| 2006/0160975 A1 | 7/2006 | Suda et al. | 526/330 |
| 2006/0178468 A1 | 8/2006 | Sato et al. | 524/556 |
| 2006/0221117 A1 | 10/2006 | Sato et al. | 347/21 |
| 2006/0235177 A1 | 10/2006 | Ikegami et al. | 526/287 |
| 2006/1022111 | 10/2006 | Sato et al. | 347/21 |
| 2006/0250463 A1 | 11/2006 | Nakazawa et al. | 347/100 |
| 2006/0264518 A1* | 11/2006 | Kato et al. | 516/33 |
| 2007/0015856 A1 | 1/2007 | Sato et al. | 524/80 |
| 2007/0032570 A1 | 2/2007 | Sato et al. | 523/160 |

FOREIGN PATENT DOCUMENTS

| | | | |
|---|---|---|---|
| JP | 64-63185 | | 3/1989 |
| JP | 8-216392 | | 8/1996 |
| JP | 11-76800 | | 3/1999 |
| JP | 11-80221 | | 3/1999 |
| JP | 11-322866 | | 11/1999 |
| JP | 11-322942 | | 11/1999 |
| JP | 2000-33712 | | 2/2000 |
| JP | 2002-121437 | * | 4/2002 |
| JP | 2002-134878 | * | 5/2002 |
| WO | WO 02/18080 A1 | | 3/2002 |

OTHER PUBLICATIONS

S. Aoshima, et al., "Living Cationic Polymerization of Vinyl Monomers by Organoaluminum Halides," Polymer Bulletin, vol. 15, No. 5 (May 1986), pp. 417-423.

E. Gulari, et al., "Photon Correlation Spectroscopy of Particle Distributions," *J. Chem. Phys.*, vol. 70, No. 8 (Apr. 15, 1979), pp. 3965-3973.

"Cho-Biryushi Gijutsu Nyuumon (Introduction to Ultra-Fine Particle Technique)," Ohm Publishing Co., Jul. 1988, title page, four table-of-contents pages, pp. 80-87, 204, and end page.

English translation of pp. 81-84 of "Cho-Biryushi Gijutsu Nyuumon".

English translation of four drawings found in pp. 81-84 of "Cho-Biryushi Gijutsu Nyuumon".

* cited by examiner

IMAGE-FORMING METHOD EMPLOYING A COMPOSITION

TECHNICAL FIELD

The present invention relates to a composition containing a polymer, an image-forming method employing the composition, and a method for forming an electroconductive pattern.

BACKGROUND ART

A substance functioning as a high-performance material is called a "performance substance" in the present invention. Performance materials are known which contain a performance substance dispersed in a dispersion material. Known performance substances include pesticides such as herbicides, and insecticides; medicines such as anticancer agents, antiallergic agents, and antiphlogistic agents; and colorants.

On the other hand, the digital printing techniques, which are typified by electrophotographic techniques and inkjet techniques, are becoming more and more important for image formation in offices and families. In particular, the digital printing techniques employing a colorant-containing composition are progressing remarkably rapidly in recent years.

The inkjet method, as a direct recording method, has advantages of compactness and low power consumption of the apparatus. The inkjet techniques are progressing rapidly in image quality by use of finer nozzles and other improvement. In an inkjet system, the ink supplied from an ink tank is heated in a nozzle by a heater to be ejected by bubbling and evaporation onto a recording medium to form an image. In another inkjet system, an ink is ejected through a nozzle by vibration of a piezo element.

In the inkjet printing, use of a pigment-dispersion ink is investigated for improvement of image weatherability and ink fixability. Use of a nano-particulate metal is also investigated: Japanese Patent Application Laid-Open No. H11-76800, for example, discloses use of a dispersion of colored nano-particulate noble metal as a paint.

Use of the inkjet technique is investigated for formation of an electroconductive organic thin film as shown, for example, in Japanese Patent Application Laid-Open No. 2000-33712.

The above-disclosed techniques need to be improved further for more excellent colorant in inkjet composition, more stable image formation with a specific composition, and more stable pattern formation.

Meanwhile, a semiconductor circuit substrate or a print wiring plate to be mounted on an information terminal is produced by any of the known processes below:

(1) Formation of a copper wiring pattern through steps of coating a copper-plated lamination plate with a resist, exposing the resist to a circuit-patterned light by photolithography, removing of non-exposed portion of the resist by dissolution, and etching of the resist-removed portion;

(2) Formation of an electroconductive pattern through steps of printing an intended pattern of an electroconductive paste on a ceramic substrate by screen printing, and sintering the metal fine particles in the electroconductive paste by heat treatment in a non-oxidative atmosphere;

(3) Formation of a copper wiring pattern through steps of vapor-depositing an electroconductive metal in a thin film layer, coating the electroconductive layer with a resist, exposing the resist to circuit-patterned light by photolithography, removing of non-exposed portion by dissolution, and etching the resist-removed portion.

With the remarkable trend to miniaturization of information terminals in recent years, the circuits of semiconductor mounted on the information terminals are coming to be miniaturized and the wiring pitches of the print wiring are made smaller. With the decrease of the minimum line breadth of the circuit pattern on the printed-wiring plate, the pattern layer thickness is also decreased. However, the process using a copper-plated lamination plate or the process by screen printing has disadvantages that a fine pattern formation is difficult, waste liquid treatment is necessary, and installation cost and production cost are high, whereas the process of the vapor deposition and etching has disadvantages that waste liquid treatment is necessary, and installation cost and production cost are high.

For canceling the above disadvantages, use of an inkjet system is investigated. For example, a wiring pattern is printed on a substrate by an inkjet system with a fine-metal particle ink containing a fine particulate metal of an average particle diameter of not larger than 100 nm dispersed in water or an organic solvent, and the printed substrate is treated by heating or light irradiation to decompose and vaporize a polymer or surfactant contained in the wiring pattern to obtain an electroconductive pattern of a prescribed film thickness (Japanese Patent Application Laid-Open No. 2002-134878). This process needs to be improved further for higher wiring density with uniformity of wiring pattern line breadth without short circuit between adjacent wiring lines; preferably with sharpening of the wiring pattern edge to prevent the short circuit.

SUMMARY OF THE INVENTION

According to an aspect of the present invention, there is provided a composition comprising an electroconductive substance, an amphiphilic block copolymers having a polyalkenyl ether repeating-unit structure, and a solvent.

The electroconductive substance is preferably a fine particulate metal. The fine particulate metal is preferably composed of a noble metal.

The electroconductive substance is preferably an organic conductive substance. The organic conductive substance is preferably selected from fullerene, carbon nano-tubes, P-type organic semiconductor substances, and N-type organic semiconductor substances.

The composition is preferably used as an ink. According to another aspect of the present invention, there is provided an image-forming method, comprising steps of applying the composition on a medium to form an image on the medium.

According to a further aspect of the present invention, there is provided a composition comprising a block copolymer enclosing an electroconductive substance, and a solvent.

The electroconductive substance is preferably a fine particulate metal. The fine particulate metal is preferably composed of a noble metal.

The electroconductive substance is preferably an organic conductive substance. The organic conductive substance is preferably selected from fullerene, carbon nano-tubes, P-type organic semiconductor substances, and N-type organic semiconductor substances. The composition is preferably used as an ink.

The composition is preferably used as an ink. According to a still further aspect of the present invention, there is provided an image-forming method, comprising steps a step of applying the composition on a medium to form an image on the medium.

According to a still further aspect of the present invention, there is provided a black ink composition, comprising a fine particulate metal having an average particle diameter of not more than 20 nm, an amphiphilic block copolymer, and a solvent. According to a still further aspect of the present invention, there is provided an image-forming method, comprising a step of applying the ink composition on a medium to form an image on the medium.

According to a still further aspect of the present invention, there is provided a method for forming an electroconductive pattern by applying a composition comprising an electroconductive substance, an amphiphilic block copolymers having a polyalkenyl ether repeating-unit structure, and a solvent on a substrate by an inkjet system to form an electroconductive pattern on the substrate.

The electroconductive substance is preferably a fine particulate metal. The fine particulate metal preferably has an average particle diameter of not more than 20 nm. Alternatively, the fine particulate metal is preferably comprised of at least one of metal elements selected from the group consisting of Au, Pt, Ag, Cu, Ni, Cr, Rh, Pd, Zn, Co, Mo, Ru, W, Os, Ir, Fe, Mn, Ge, Sn, Ga, Ta, Bi, Ti, and Al.

The electroconductive substance is preferably an organic metal compound containing at least one of metal elements selected from the group of Au, Pt, Ag, Cu, Ni, Cr, Rh, Pd, Zn, Co, Mo, Ru, W, Os, Ir, Fe, Mn, Ge, Sn, Ga, Ta, Bi, Ti, and Al.

The method preferably comprises a step of fixing the electroconductive pattern by stimulating the composition after application of the composition on the substrate. The stimulation is preferably at least one selected from temperature change, electromagnetic wave irradiation, pH change, concentration change, addition of a cationic compound or anionic compound.

The method preferably comprises a step of treating the substrate by heat or light to decompose and vaporize the block copolymer contained in the electroconductive pattern after application of the composition on the substrate.

According to a still further aspect of the present invention, there is provided a method for forming an electroconductive pattern by applying a composition comprising a block copolymer enclosing an electroconductive substance, and a solvent on a substrate by an inkjet system to form an electroconductive pattern on the substrate.

The electrocondudtive substance is preferably a fine particulate metal. The fine particulate metal preferably has an average particle diameter of not more than 20 nm. Alternatively, the fine particulate metal is preferably comprised of at least one of metal elements selected from the group consisting of Au, Pt, Ag, Cu, Ni, Cr, Rh, Pd, Zn, Co, Mo, Ru, W, Os, Ir, Fe, Mn, Ge, Sn, Ga, Ta, Bi, Ti, and Al.

The electroconductive substance is preferably an organic metal compound containing at least one of metal elements selected from the group of Au, Pt, Ag, Cu, Ni, Cr, Rh, Pd, Zn, Co, Mo, Ru, W, Os, Ir, Fe, Mn, Ge, Sn, Ga, Ta, Bi, Ti, and Al.

The method preferably comprises a step of fixing the electroconductive pattern by stimulating the composition after application of the composition on the substrate. The stimulation is preferably at least one selected from temperature change, electromagnetic wave irradiation, pH change, concentration change, addition of a cationic compound or anionic compound.

The method preferably comprises a step of treating the substrate by heat or light to decompose and vaporize the block copolymer contained in the electroconductive pattern after application of the composition on the substrate.

The composition of the present invention is stabilized in dispersion by use of a specific block copolymer and is suitable for image formation. In particular, the ink composition which contains fine metal particles of a specified average particle diameter has excellent color-developing properties. The composition of the present invention which contains an electroconductive substance and a specified block copolymer is suitable for formation of an electroconductive pattern. According to the process for electroconductive pattern formation of the present invention, an electroconductive pattern can be formed with sharp pattern edges owing to the specific block copolymer.

BEST MODE FOR CARRYING OUT THE INVENTION

The present invention is described below in detail.

The composition of the present invention comprises an electroconductive substance, a specified block copolymer, and a solvent. The electroconductive substance includes fine particulate metals and organic conductive substances.

Firstly, an embodiment is explained which employs a fine particulate metal as the electroconductive substance.

The composition of the present invention includes coloring compositions comprising a fine particulate metal, an amphiphilic block copolymer, and a solvent.

The composition of the present invention includes coloring compositions comprising a fine particulate metal, an amphiphilic block copolymer having a repeating unit structure of a polyalkenyl ether, and a solvent.

The composition of the present invention includes black ink compositions comprising a fine particulate metal having an average particle diameter of not larger than 20 nm, an amphiphilic block copolymer, and a solvent.

The composition of the present invention includes compositions containing a fine particulate metal enclosed by a block copolymer in a microsphere state.

The metal employed in the composition may be any of the metals of Periodic Table. The metal is preferably a noble metal. The noble metal includes gold, silver, copper, platinum, palladium, ruthenium, and rhodium. The fine particulate metal has preferably an average diameter of the primary particles of preferably not larger than 100 nm, more preferably not larger than 50 nm, still more preferably not larger than 30 nm in view of coloring property and color-developing property of the composition. For preparing a composition for developing a black color, which is the based color for display and recording, with excellent color-developability, the average particle diameter is preferably not larger than 20 nm.

Such a fine particulate metal can be produced, for instance, by a process described in a book "Cho-Biryushi Gijutsu Nyuumon (Introduction to Ultra-Fine Particle Technique)" published by Ohm Publishing Co., 1988, July)". As an example, the fine particulate metal can be produced by a gas evaporation process: in this process, a metal is vaporized by heating by a heater, a plasma jet, high frequency induction, an electron beam, or a laser beam; and allowing an inert gas to flow to form physically fine particles. In another method, the fine particulate metal can be produced by sputtering, or blowing onto a flowing oil surface. In still another method, the fine particulate metal is produced chemically by reduction of a metal compound by an amine and simultaneous colloid formation by surfactant compound like a thiol to form a stable dispersion of a nano-size particulate metal (e.g., Shikizai (Colorants), vol. 75(2), p. 66, 2002).

The production of the coloring composition of the present invention comprising an amphiphilic block copolymer having a polyalkenyl ether repeating-unit structure and a solvent can be conducted, for instance, by a process mentioned below:

(1) The fine particulate prepared by the above physical method is directly dispersed in an amphiphilic block copolymer having the polyalkenyl ether repeating-unit structure, and a solvent or in a dispersion medium;
(2) The fine particulate prepared by the above physical method is mixed with a solvent and an amphiphilic block copolymer having the polyalkenyl ether repeating-unit structure, or the fine particulate dispersion in a solvent is introduced and dispersed in micelles or reversed micelles formed by the an amphiphilic block copolymer having the polyalkenyl ether repeating-unit structure;
(3) In the aforementioned chemical process for producing the fine particulate, an amphiphilic block copolymer having the polyalkenyl ether repeating-unit structure is used as a surfactant to form a dispersion composition.
(4) The fine particulate dispersion in a solvent prepared by the aforementioned chemical process is introduced and dispersed in micelles or reversed micelles formed by an amphiphilic block copolymer having the polyalkenyl ether repeating-unit structure.

The production process of the composition of the present invention is not limited to the above processes.

A process is explained for producing a black ink composition comprising a fine particulate metal having an average particle diameter of not larger than 20 nm, an amphiphilic block copolymer, and a solvent. Similar processes as described above are applicable. In the process, the size of the fine particulate metal is controlled to be not larger than 20 nm in average. The particle size may be controlled in the preparation step, or once-prepared particulate may be classified by centrifugation or a like classification method to control the average particle diameter to be not larger than 20 nm.

The block copolymer characteristically used in the present invention is called a block copolymer or a block polymer, which is a copolymer constituted of different polymer segment structures linked linearly by a covalent bond. The block copolymer includes specifically acryl and methacryl type block copolymers, block copolymers constituted of polystyrene and another addition polymer or condensation polymer, block copolymers having a block of polyoxyethylene or polyoxyalkylene, and other known block copolymers. In the present invention, the block copolymer is more preferably of types of AB, ABA, and ABD, with A, B, and D representing respectively a different block segment. The block copolymer in the present invention may be a graft copolymer in which a polymer segment is linked in a T-shape to a copolymer chain. In the block copolymer, the segment may be a copolymer segment. The copolymer segment is not limited in the type of the copolymerization, and may be a random segment, or a gradation segment.

Next, a process for producing a solvent-containing composition is explained in which the fine particulate metal is enclosed in the block copolymer in a microsphere state. The process is similar to the aforementioned processes (1) to (4).

However, for covering the fine particulate metal with a block copolymer to form microspheres (i.e., enclosure of the fine particulate metal in the block copolymer), process (2) or (4) is preferred in view of the microsphere formation. That is, in process (2), the fine particulate prepared by the above physical method is mixed with a solvent and an amphiphilic block copolymer, or the fine particulate dispersion in a solvent is introduced and dispersed in micelles or reversed micelles formed by an amphiphilic block copolymer; and in process (4), the fine particulate dispersion in a solvent prepared by the aforementioned chemical process is introduced and dispersed in micelles or reversed micelles formed by an amphiphilic block copolymer.

The microsphere in the present invention signifies a particle having a structure that a particulate core substance composed of at least one kind of fine particulate metal or the like is dispersed inside the particle, and another substance covers entirely the outside of the particle.

Next, the composition of the present invention employing an organic conductive substance as the electroconductive substance is explained below.

This type of composition of the present invention comprises an organic conductive substance, a block copolymer having a polyalkyl ether repeating-unit structure, and a solvent. The composition includes those having the organic conductive substance enclosed in the block copolymer in a microsphere state. The organic conductive substance is an electroconductive substance mainly constituted of carbon atoms, and includes fullerenes; carbon nano-tubes; and compounds having a resonancing aromatic ring or unsaturated carbon bond such as polyacetylenes, polyvinylphenylenes, polythiophenes, polyfurans, pentacenes, hexacenes, heptacenes, octacenes, triphenylenes, tatracenes, and substitution derivatives thereof. These substances have p-type or n-type semiconductor characteristics, and are useful as a semiconductor.

The production of the composition of the present invention which comprises an organic conductive substance, a block copolymer having a polyalkenyl ether repeating-unit structure, and a solvent or a dispersion medium can be conducted, for instance, by mixing the organic conductive substance and the block copolymer in a solvent and dispersing the mixture by a dispersion machine. The dispersion machine includes homogenizers, bead mills, and paint shakers. Otherwise, the dispersion may be conducted by mixing the organic conductive substance and the block copolymer in a solvent, and causing phase inversion in another solvent insoluble to the above solvent. In this phase inversion method, an aqueous solvent is used as one of above two solvents and an amphiphilic polymer is used as the block copolymer to achieve sufficient dispersion and to enable enclosure of organic conductive substance. Otherwise, the amphiphilic block copolymer may be dispersed in a micelle state or a reversed micelle state in a solvent and the organic conductive substance is mixed thereto for sufficient dispersion and satisfactory enclosure. In mixing, the organic conductive substance is preferably dispersed or dissolved in a solvent occasionally. The description above does not limit the present invention.

A process for producing a solvent-containing composition is explained in which the organic conductive substance is enclosed in the block copolymer in a microsphere state. This production may be conducted similarly as above. In this process, the organic conductive substance is preferably dispersed or dissolved in a solvent for formation of microspheres.

In this embodiment, the same block copolymer is used as the one mentioned above.

Next, the process for producing an electroconductive pattern of the present invention is explained below. A process in the present invention for forming a wiring pattern on a prescribed position on a substrate comprises (A) a step of drawing a wiring pattern by applying a coloring composition comprising a fine particulate metal, an amphiphilic block copolymer having a polyalkenyl ether repeating-unit structure, and a solvent or a dispersion medium by use of a liquid ejection apparatus equipped with a liquid ejecting means and a driving means for driving the liquid ejecting means; (B) a step of fixing the wiring pattern by applying external stimulation; and (C) a step of treating the substrate by heat or a light beam to decompose and vaporize the block copolymer contained in the wiring pattern.

Another process in the present invention for forming a wiring pattern on a prescribed position on a substrate comprises (A) a step of drawing a wiring pattern by applying a black ink composition comprising a fine particulate metal having an average particle diameter of not larger than 20 nm, an amphiphilic block copolymer, and a solvent by use of a liquid ejection apparatus equipped with a liquid ejecting means and a driving means for driving the liquid ejecting means; (B) a step of fixing the wiring pattern by applying external stimulation; and (C) a step of treating the substrate by heat or a light beam to decompose and vaporize the block copolymer contained in the wiring pattern.

Still another process in the present invention for forming a wiring pattern on a prescribed position on a substrate comprises (A) a step of drawing a wiring pattern by applying a solvent-containing composition containing a fine particulate metal enclosed in a block copolymer in a microsphere state by use of a liquid ejection apparatus equipped with a liquid ejecting means and a driving means for driving the liquid ejecting means; (B) a step of fixing the wiring pattern by applying an external stimulation; and (C) a step of treating the substrate by heat or a light beam to decompose and vaporize the block copolymer contained in the wiring pattern.

The fine particulate metal as the electroconductive substance in the composition is preferably composed of at least one of metals selected from the group of Au, Pt, Ag, Cu, Ni, Cr, Rh, Pd, Zn, Co, Mo, Ru, W, Os, Ir, Fe, Mn, Ge, Sn, Ga, Ta, Bi, Ti, and Al. The organic metal compound as the electroconductive substance is preferably contains at least one of metals selected from the group of Au, Pt, Ag, Cu, Ni, Cr, Rh, Pd, Zn, Co, Mo, Ru, W, Os, Ir, Fe, Mn, Ge, Sn, Ga, Ta, Bi, Ti, and Al. The organic metal compound is exemplified by an organic copper complex $Cu(OCH_2CH_2OCH_3)_2$, an organic nickel complex $Ni\ (OOCC_7H_{15})(OC_3H_7)$, and an organic platinum complex $Pt(CH_3COCHCOCH_3)_2$, but is not limited thereto.

With miniaturization of the circuit, the minimum line breadth of the circuit pattern is made smaller, and the thickness thereof is also made smaller. With the decreased line breadth and thickness, the number of the metal particles holdable for the breadth and thickness of the pattern is limited to several particles, if the metal particles are larger than a certain size. The decrease of the number of the metal particles can cause increase of variation of the electric conductivity or failure of contact between the metal particles to impair the electric conductivity. Therefore, the average particle diameter of the primary particles is preferably not larger than 100 nm, more preferably not larger than 50 nm, still more preferably not larger than 30 nm. Still more preferably, the fine particulate metal is a black particulate metal of an average particle diameter of not larger than 20 nm.

In any of the above cases, a block copolymer is used. The preferred block copolymers have a polyalkenyl ether repeating-unit structure and are amphiphilic.

The processes for synthesizing the block copolymer having the polyalkenyl ether structure of the present invention are disclosed in many papers (e.g., Japanese Patent Application Laid-Open No. H11-080221). Typical is a cationic living polymerization reported by Aoshima et al. (polymer Bulletin Vol. 15, 1986, p. 417; Japanese Patent Laid-Open Nos. H11-322942, and H11-322866). By the cationic living polymerization, various polymers can be synthesized, including homopolymers, copolymers constituted of two or more monomers, block copolymers, graft copolymers, and gradient copolymers with precisely uniform chain length (molecular weight). Varieties of functional group can be introduced to the side chain of the polyalkenyl ether. The cationic polymerization can also be conducted by an $HI/I_2$ system, an $HCl/SnCl_4$ system, or a like system. The block copolymer having a polyalkenyl repeating unit structure is constituted of 50 mol % or more of the polyalkenyl ether units, more preferably 80 mol % or more. Still more preferably, the block copolymer is constituted of 90 mol % or more, virtually entirely, of the polyalkenyl ether units. The block copolymers containing a polyalkenyl ether structure are preferably used in the present invention. Particularly preferred are block copolymers having a polyvinyl ether structure represented by General Formula (1) below.

—(CH₂—CH(OR¹))—    (1)

[wherein $R^1$ is selected from the group consisting of linear, branched, or cyclic alkyl groups of 1 to 18 carbon atoms, —(CH($R^2$)—CH($R^3$)—O)—$R^4$, and —(CH₂)$_m$—(O)$_n$—$R^4$; l and m are independently an integer from 1 to 12; n is 0 or 1; $R^2$ and $R^3$ are independently H or CH₃; $R^4$ is selected from the group consisting of H, linear, branched or cyclic alkyl groups of 1 to 6 carbon atoms, -Ph, -Pyr, -Ph-Ph, -Ph-Pyr, —CHO, —CH₂CHO, —CO—CH=CH₂, —CO—C(CH₃)=CH₂, —CH₂COOR⁵; the hydrogen on the carbon atoms constituting $R^4$, when $R^4$ is other than hydrogen, may be replaced by a linear or branched alkyl group of 1 to 4 carbon atoms, F, Cl, or Br, and the carbon in the aromatic ring may be replaced by nitrogen; and $R^5$ is H, or an alkyl group of 1 to 5 carbon atoms]

In the present invention, -Ph represents phenyl, -Pyr represents pyridyl, -Ph-Ph represents biphenyl, and -Ph-Pyr represents pyridylphenyl. The groups of pyridyl, biphenyl, and pyridylphenyl include possible positional isomers.

An amphiphilic block copolymer is preferably used in the present invention. For instance, the amphiphilic block copolymer can be obtained by synthesis by selecting a hydrophobic block segment and a hydrophilic block segment from the repeating unit structures represented by General Formula (1) above.

Vinyl ether monomers are shown below as examples of the repeating unit of the polyvinyl ether structure of the block copolymer, but the polyvinyl ether structure in the present invention is not limited thereto.

(I-a)

(I-b)

(I-c)

(I-d)

(I-e)

(I-f)
(I-g)
(I-h)
(I-i)
(I-j)
(I-k)
(I-l)
(I-m)
(I-n)
(I-o)

In the formulas above, Me represents methyl, Et represents ethyl, and i-Pr represents isopropyl. Examples of the polyvinyl ether structures constituted of the above vinyl ether monomers are shown below, but the copolymer in the present invention is not limited thereto.

(II-a)
(II-b)

(II-c)
(II-d)

In the above polyvinyl ethers the repeating unit numbers u, v, and w are independently a number of preferably 1 to 10,000, and the total (u+v+w) is preferably in the range from 10 to 20,000.

The block copolymer in the present invention has a molecular weight distribution Mw/Mn ((weight-average molecular weight)/(number-average molecular weight)) of not more than 2.0, more preferably not more than 1.6, and still more preferably not more than 1.3, still more preferably not more than 1.2. The block copolymer in the present invention has a number-average molecular weight ranging preferably from 1,000 to 300,000. The block copolymer having a number-average molecular weight lower than 1000 or higher than 300,000 may be incapable of dispersing the substance having the intended function in a solvent.

The block copolymer molecule is desirably more flexible for dispersion stabilization and enclosure by physical entanglement of the molecule with the surface of the functional substance. The flexibility is desirable for formation of a coating layer on a recording medium as described later. For achieving the flexibility, the glass transition temperature Tg of the main chain of the block copolymer is preferably not higher than 20° C., more preferably not higher than 0° C., and still more preferably not higher than −20° C. From this point of view, the copolymers having a polyvinyl ether structure are preferable which have a lower glass transition temperature and a flexible molecular structure. The block copolymer is contained in the composition of the present invention at a content ranging from 0.1 to 90 wt %, preferably from 0.5 to 50 wt %. At a content of the block copolymer of lower than 0.1 wt %, the block copolymer may be incapable of dispersing or enclosing sufficiently the colorant contained in the ink composition of the present invention, whereas at a content of higher than 90 wt %, the viscosity may become excessively high.

The fine particulate metal in the present invention is contained at a total content ranging from 0.01 to 99.5 wt % based on the total weight of the composition. At a content of the fine particulate metal of lower than 0.01 wt %, a sufficient functionality may not be achieved, whereas at a content thereof higher than 99.5 wt %, the dispersibility may be poor. More preferably the content is in the range from 1 to 90 wt % and more preferably 2 to 70 wt %.

The organic conductive substance in the present invention is contained at a content of 0.01 to 99.5 wt % based on the total weight of the composition. At a content lower than 0.01 wt %, sufficient function may not be achieved, whereas at a content of 99.5 wt %, the dispersibility may become poor. More preferably the content is in the range from 1 to 90 wt %, and more preferably from 2 to 70 wt %.

The fine particulate metal or the organic conductive substance is preferably enclosed in the block copolymer in the present invention. The enclosure in the amphiphilic block copolymer improves remarkably the dispersion stability, and protects the fine particulate metal or organic conductive substance from a chemical change which can be caused by external environment. A microsphere which encloses plural primary metal particles has a much larger size than the preferred size of a primary particle, namely not larger than 100 nm, or 50 nm, or 30 nm, or 20 nm, of the fine particulate metal, whereby the microspheres can be dispersed, with little loss of color developability or coloring ability, much more stably than dispersion of the primary particles. Therefore the microsphere is remarkably advantageous. In particular, when plural solvents are used or an additive is used, the primary particles are not necessarily dispersed stably in comparison with the microspheres.

The state of the aforementioned enclosure can be confirmed by instrumental analysis such as electron microscopy and X-ray diffraction. The enclosure state in a micelle state can be confirmed indirectly by independent isolation of the fine particulate metal or organic conductive substance from the solvent separately from the copolymer.

The average size of the particles in the composition of the present invention, in particular in use for colorant, is preferably not larger than 400 nm, more preferably not larger than 200 nm, for preventing light scattering and turbidity, since the size larger than 400 nm is in the visible light wavelength region and can cause light scattering.

The organic conductive substance in the composition of the present invention has an average particle diameter preferably of not larger than 400 nm, and more preferably not larger than 200 nm, in consideration of the dispersion stability. The average particle diameter can be measured by various methods such as direct observation by electron microscopy, small-angle neutron diffraction, small-angle X-ray diffraction, light scattering, and laser diffraction. The particle size of a 200-nm level can be measured suitably by dynamic light scattering. The particle size distribution can be measured by the dynamic light scattering as a photon correlation method. The uniformity of the particle size is generally represented by the dispersability index proposed by Gulari (The Journal of Chemical Physics, Vol. 70. p. 3965, 1979). The dispersability index is preferably not larger than 0.3, more preferably not larger than 0.2, and still more preferably not larger than 0.1. A smaller dispersability index denotes a narrower particle distribution. A particle size tester by dynamic light scattering is exemplified by DLS7000 supplied by Ohtsuka Denshi K.K., and so forth.

The composition of the present invention contains a solvent. The solvent to be contained in the composition of the present invention is not limited, and should be capable of dissolving, suspending, or dispersing the components contained in the composition. The solvent includes organic solvents such as linear, branched or cyclic aliphatic hydrocarbons, aromatic hydrocarbons, and heteroaromatic hydrocarbons; aqueous solvents; and water; and mixture thereof. In particular, in the composition of the present invention, water, and aqueous solvents are suitably used. The aqueous solvents include polyhydric alcohols such as ethylene glycol, diethylene glycol, triethylene glycol, polyethylene glycol, propylene glycol, polypropylene glycol, and glycerin; polyhydric alcohol ethers such as ethylene glycol monomethyl ether, ethylene glycol monoethyl ether, ethylene glycol monobutyl ether, diethylene glycol monoethyl ether, and diethylene glycol monobutyl ether; and nitrogen-containing solvents such as N-methyl-2-pyrrolidone, substituted pyrrolidone, and triethanolamine. A monohydric alcohol such as methanol, ethanol, and isopropyl alcohol may be used. The pH of the water is not limited: preferably within the range from 1 to 14. The content of the above organic solvent or water and the aqueous solvent ranges preferably from 20 to 99 wt %, more preferably from 30 to 98 wt % based on the total weight of the composition in the present invention.

The composition of the present invention may contain an additive or an auxiliary as necessary. An example of the additive is a dispersion stabilizer for dispersing a pigment stably in the solvent. A second stabilizer may be used in combination to improve the dispersion. Examples of the above second dispersion stabilizer are resins or surfactants having a hydrophilic portion and a hydrophobic portion. The resin having a hydrophilic portion and a hydrophobic portion includes a copolymer of a hydrophilic monomer and a hydrophobic monomer.

The hydrophilic monomer includes carboxylic acids such as acrylic acid, methacrylic acid, maleic acid, and fumaric acid; monoesters of the above carboxylic acids; vinylsulfonic acid; styrenesulfonic acid; vinyl alcohol; acrylamide; and methacryloxyethyl phosphonate. The hydrophobic monomer includes styrenes such as styrene, and α-methylstyrene; vinylcyclohexane; vinylnaphthalene; acrylate esters; and methacrylate esters. The copolymer includes copolymers of various constitutions such as random copolymers, block copolymers, and graft copolymers. Naturally, the hydrophilic monomer and the hydrophobic monomer are not limited to the above-mentioned monomers.

The surfactant includes anionic surfactants, nonionic surfactants, cationic surfactants, and amphiphilic surfactants.

The anionic surfactants include fatty acid salts, alkyl sulfate ester salts, alkylarylsulfonate salts, alkyl diaryl ether disulfonate salts, dialkylsulfosuccinate salts, alkyl phosphate salts, naphthalenesulfonic acid-formalin condensates, polyoxyethylene alkyl phosphate ester salts, and glycerol borate fatty acid esters.

The nonionic surfactants include polyoxyethylene alkyl ether, poly(oxyethylene-oxypropylene) block copolymers, sorbitan fatty acid esters, glycerin fatty acid esters, polyoxyethylene fatty acid esters, polyoxyethylene-alkylamine, fluorine type surfactants, and silicon type surfactants.

The amphiphilic surfactants include alkylbetaines, alkylamine oxides, and phosphadylcholine.

The surfactants are not limited to the above-mentioned ones.

For the use of another additive, for example, as an ink, a second additive other than the dispersion stabilizer includes pH-adjusting agents for stabilization of the ink and stabilization of ink tubing in a recording apparatus, penetrants for promoting penetration of the ink into the recording medium to accelerate apparent drying, fungicides to prevent growth of a fungi in the ink, chelating agents for blocking metal ions in the ink to prevent deposition of a metal in a nozzle or deposition of insoluble matter in the ink, antifoaming agents for preventing foam generation during circulation or delivery or the ink or ink preparation, antioxidants, fungicides, viscosity controlling agents, and UV absorbing agents.

The composition of the present invention may contain another additive not mentioned above.

The aforementioned composition is preferably used as an inkjet ink composition. A preferred embodiment of the present invention is an inkjet ink, more preferably an ink for an on-demand type inkjet printing. The on-demand type inkjet printing system includes thermal systems and piezo systems, both requiring low viscosity of the ink, typically a viscosity of not higher than 10 cp. In a preferred embodiment of the present invention, the low viscosity of the ink can be achieved by dispersing a colorant enclosed in an amphiphilic block copolymer. A narrower molecular weight distribution of the block copolymer is preferred for the lower viscosity. For fixability of the ink to a recording medium and inkjet printing properties, the block copolymer preferably has three or more block segments: more preferably the block copolymer has a hydrophobic segment, a nonionic hydrophilic segment, and an ionic segment arranged in this order.

The image-forming method of the present invention forms an image by use of the aforementioned composition by the inkjet printing. The composition of the present invention is useful for printing with an inkjet image-forming system. The inkjet system may be a conventional system such as a piezo inkjet system employing a piezo element, and a thermal inkjet system conducting recording by bubbling by action of a thermal energy. The system may be a continuous type, or an on-demand type. The ink composition of the present invention is useful for a recording system in which printing is made on an intermediate transfer medium with the ink and the printed image is transferred onto a final recording medium such as a paper sheet.

An embodiment of the liquid ejecting means employed in the present invention is an inkjet system. In this system, an image is formed by ejecting fine liquid droplets, so that the printable minimum line breadth and the minimum circuit interval depend largely on the quantity of the liquid droplets. In recent years, in the inkjet system employed in the present invention, the quantity of the liquid drop can be reduced to several picoliters. Thereby, with this system, a wiring pattern can be formed at a high density, for example, with circuit intervals of as small as not more than 0.3 mm.

A preferred inkjet system in the present invention is an on-demand type inkjet system. The on-demand type inkjet system includes thermal type systems and piezo type systems. In either system, the ink is required to have a very low viscosity, typically not higher than 10 cps. The ink of the preferred embodiment of the present invention is made to have a very low viscosity by enclosing the dispersed colorant in an amphiphilic block copolymer. A narrower molecular weight distribution of the block copolymer is preferred for the lower viscosity. For fixability of the ink to a recording medium and inkjet printing properties of the ink, the block copolymer has preferably three or more block segments: more preferably the block copolymer has a hydrophobic segment, a nonionic hydrophilic segment, and an ionic segment arranged in this order.

A preferred embodiment of a liquid ejection system in the present invention is an inkjet recording system. The inkjet system may be a conventional system such as a piezo inkjet system employing a piezo element, and a thermal inkjet system conducting recording by bubbling by action of a thermal energy. The system may be a continuous type, or an on-demand type.

Figure 1:
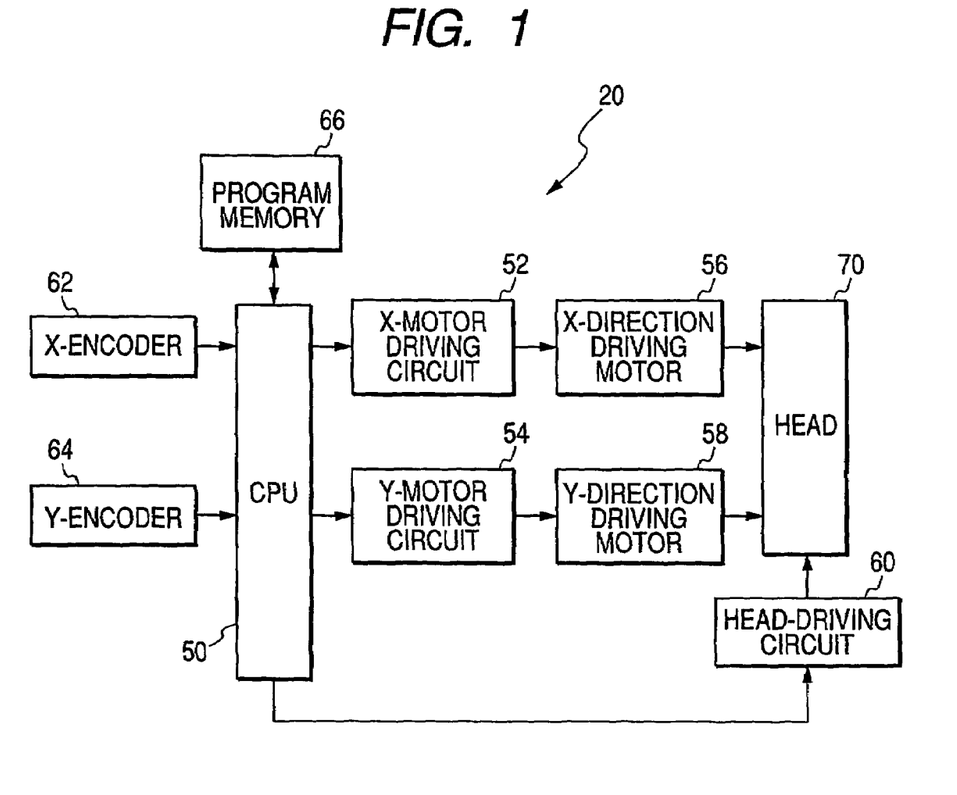
FIG. 1 is a schematic diagram showing an outline of a system for applying a composition of the present invention.

FIG. 1 is a schematic functional diagram of the inkjet recording system. The numeral 50 denotes a central processing unit (CPU) of inkjet recording system 20. The program for controlling CPU 50 may be memorized in program memory 66, or a memory means such as a so-called EEPROM (not shown in the drawing) as a firmware. The inkjet system receives recording data from a recording data-preparing means (not shown in the drawing; a computer or the like) by program memory 66. The recording data may be information on an image or character to be recorded, compressed information thereof, or coded information. In processing the compressed or coded information, the image or character information to be recorded can be obtained by expansion or depression by CPU 50. X-encoder 62 (e.g., relating to X-direction or a main scanning direction) and Y-encoder 64 (e.g., relating to Y-direction or sub-scanning direction) may be provided to inform the position of a recording head relative to a recording medium to CPU 50.

CPU 50 transmits signals for recording an image to X-motor driving circuit 52, Y-motor driving circuit 54, and head driving circuit 60 based on information from program memory 66, X-encoder 62, and Y-encoder 64. X-motor driving circuit 52 drives X-direction driving motor 56, and Y-motor driving circuit 54 drives Y-direction driving motor 58 to move head 70 relative to the recording medium to a recording position. At the time when head 70 has reached the recording position, head-driving circuit 60 transmits signals for ejection of respective ink compositions (Y, M, C, and K) to head 70 for recording. The head 70 may be a head for ejection of a single color ink composition, or may be a head for ejection of plural ink compositions.

The present invention also relates to a method for forming a pattern with the composition of the present invention by an inkjet system. The composition of the present invention is useful for pattern formation by various inkjet systems. The inkjet system may be any of conventional systems including piezo inkjet systems employing a piezo element, and thermal inkjet systems utilizing bubbling by action of a thermal energy, and may be either a continuous type or an on-demand type. The composition of the present invention can be used in a transfer recording system in which printing is conducted once on an intermediate medium and the print is transferred to a final recording medium like a paper sheet. In recording a pattern by an inkjet system, the composition of the present invention has a relatively low viscosity advantageously to enable formation of an excellent pattern, since the solvent-containing composition comprises an organic conductive substance, a block copolymer having a polyalkenyl ether repeating-unit structure, and a solvent; or contains an organic conductive substance enclosed by a block copolymer in a microsphere state. In particular, an excellent pattern can be recorded with less dependence on the properties of the organic conductive substance owing to enclosure of the organic conductive substance. The dispersed ink enclosed in an amphiphilic block copolymer can be changed variously in response to external stimulation. This is useful in secondary pattern formation after dotting of the liquid droplets of the composition. For example, after formation of a line pattern with a composition of the present invention, the microsphere enclosure state of the composition is destroyed by stimulation response to uncover the organic conductive substance, and the patterned organic conductive substance is coated with the remaining block copolymer. Otherwise, a strong pattern of an organic conductive substance can be formed by sintering by utilizing the difference in thermal properties from that of the organic conductive substance. The system explained above by reference to FIG. 1 can be suitably used for the pattern formation of the present invention.

In the electroconductive pattern forming method of the present invention, an electroconductive pattern is formed by applying a composition comprising an electroconductive substance, an amphiphilic block copolymer having a polyalkenyl ether repeating-unit structure, and a solvent by an inkjet method on a substrate. The electroconductive pattern-forming method of the present invention includes a method which applies a composition comprising a block copolymer enclosing an electroconductive substance and a solvent by an inkjet method on a substrate. The electroconductive substance includes fine particulate metals.

A preferred embodiment of the electroconductive pattern-forming method of the present invention is explained below.

The substrate employed in the method of the present invention is desirably made of a material capable of withstanding the heat treatment (Step C) mentioned later. The substrate includes polyimide films, polyamidoimide films, polyamide films, polyester films, glass-epoxy resin substrates, paper-phenol resin substrates, silicon substrates, ceramic substrates, and glass substrates.

In the wiring pattern-forming method of the present invention, a dispersion composition containing a fine particulate metal is applied by an inkjet system to draw a wiring pattern on a substrate (Step A); and an external stimulation is given to the drawn wiring pattern to promote the fixation of the image to the substrate for a high-density wiring pattern with a uniform pattern line breadth without contact of adjacent wiring lines (Step B).

The external stimulation in the present invention includes a temperature change, an electromagnetic change, a pH change, and a concentration change. The deposited composition is treated for viscosity increase by aggregation or sol-gel transition to form a high-density wiring pattern with uniform line breadth without line broadening and without overlap between adjacent circuits.

The external stimulation in the present invention may be of one kind or of plural kinds. The external stimulations are explained below.

(a) Stimulation by Temperature

The temperature change of the ink is caused on ejection from the temperature of the ink in an ink tank to the temperature of the ink ejected and deposited onto a recording medium. This temperature change causes phase inversion of the inkjet ink composition of the present invention to result in rapid viscosity increase or insoluble matter aggregation.

(b) Stimulation by Electromagnetic Wave

Electromagnetic stimulation is given by light exposure of an ink ejected from a dark ink tank to visible light, or by irradiation of an electromagnetic wave from an electromagnetic wave irradiation assembly equipped in an inkjet recording apparatus. The electromagnetic stimulation causes polymerization of polymerizable functional group to result in viscosity increase or insoluble matter aggregation.

(c) Stimulation by pH Change

The pH of an ink composition is changed by action of a recording medium on which the ink is deposited. The pH change causes phase inversion of the inkjet ink composition of the present invention to result in viscosity increase or insoluble matter aggregation.

(d) Stimulation by Concentration Change

The concentration of the ink composition is changed after ejection from an ink tank onto a recording medium by evaporation of water or an aqueous solvent or absorption thereof by the recording medium. This concentration change causes phase inversion of the inkjet ink composition of the present invention to result in rapid viscosity increase or insoluble matter aggregation.

(e) Stimulation by Addition of a Cationic Compound or an Anionic Compound

A cationic compound or an anionic compound is added before or after deposition onto a recording medium, or an ink composition is deposited onto a recording medium on which a cationic compound or an anionic compound has been preliminarily applied. The cationic or anionic compound causes phase inversion of the inkjet ink composition of the present invention to result in viscosity increase or insoluble matter aggregation.

The above changes of the ink properties can result in higher fixability. The change of the properties is not limited to the aforementioned increase of viscosity or aggregation of an insoluble component.

The stimulation can be applied in various ways. In one of the preferred methods, the stimulating substance is mixed with or brought into contact with the stimulation-responsive ink. For example, to a pH-responsive ink, as shown in the above item (c), an effective pH-stimulating substance is applied by an inkjet method. As shown in Japanese Patent Application Laid-Open No. S64-63185, a stimulating substance can be applied from an inkjet head over the entire face of image formation area. Otherwise as shown in Japanese Patent Application Laid-Open No. H8-216392, an image of a higher quality can be formed by controlling the amount of a stimulating substance.

In a wiring pattern-forming method of the present invention, subsequent to Steps A and B, a substrate carrying a wiring pattern formed thereon is treated with heat or light to decompose and vaporize a block polymer contained in the wiring pattern to complete the wiring pattern formation on the substrate (Step C).

Generally, a fine particulate metal having an average particle diameter of several to tens of nanometers (e.g., 200 nm for silver) is known to become sintered at a temperature remarkably lower than its melting point. Therefore, heat- or light-treatment of the substrate can decompose and vaporize the block copolymer and simultaneously sinter the fine particulate metal to complete the wiring pattern formation.

In Step C in the present invention, only one of the heat treatment and the light treatment may be conducted, or the both thereof may be conducted successively or simultaneously.

The pattern-forming method of the present invention is useful for formation of a matrix wiring, but is not limited thereto. For example, a surface conduction type electron-emitting element is placed on a matrix formed by a pattern forming method of the present invention, and this matrix wiring is enclosed in an air-tight vessel to complete an image display device employing the electron-emitting element as an electron source. Incidentally, the surface conduction type electron-emitting element emits electrons to a vacuum space from an electron-emitting region formed on an electroconductive thin film by applying a voltage from a pair of electrodes called element electrodes td an electroconductive thin film containing fine particles formed on a substrate. The image display apparatus employing the above surface conduction type electron-emitting elements forms an image by projecting the electrons emitted from the above surface conduction type electron-emitting element onto a fluorescent substance.

A matrix wiring according to the pattern forming method of the present invention can be conducted through the steps below.

(a) An X wiring or Y wiring of an XY matrix wiring is formed on a substrate by applying a dispersion composition containing a fine particulate metal by means of the above-mentioned liquid ejection apparatus (Step A). An external stimulation is given to the formed wiring pattern to promote the fixation of the image to the substrate for high-density wiring pattern with uniform pattern line breadth without overlap between adjacent wiring lines (Step B). Subsequent to Steps A and B, a substrate carrying a wiring pattern thereon is treated with heat or light to decompose and vaporize a block polymer contained in the wiring pattern to complete the wiring pattern formation on the substrate (Step C).

(b) The wiring of an insulation layer is patterned and sintered.

(c) The other wiring of the matrix wiring is formed in pattern in the same manner as in the above item (a).

As described above, the matrix wiring of the present invention is applicable to display panels and image forming apparatuses.

EXAMPLES

The present invention is explained by reference to Examples without limiting the invention thereto.

Example 1

Synthesis of Block Copolymer-1

Synthesis of Block Copolymer Constituted of Isobutyl Vinyl Ether (IBVE: Block A) and Ethyl 4-(2 Vinyloxy)ethoxybenzoate (VEOEtPhCOOEt: Block B)

A glass container having a three-way stopcock was purged with nitrogen, and was heated in a nitrogen atmosphere to 250° C. to eliminate adsorbed water. The system was brought to room temperature. Thereto, were added 12 mmol of IBVE, 16 mmol of ethyl acetate, 0.05 mmol of 1-isobutoxyethyl acetate, and 11 mL of toluene. The reaction system was cooled to 0° C. Thereto 0.2 mmol of ethylaluminum sesquichloride (an equimolar mixture of diethylaluminum chloride and ethylaluminum dichloride) was added to initiate polymerization. The molecular weight of the growing polymer was monitored at prescribed time intervals by molecular sieve column chromatography (GPC) to detect completion of the polymerization of block A.

Thereto a solution of 10 mmol of VEOEtPhCOOEt (block B) in 13 mL of toluene was added, and polymerization was continued. After 20 hours, the polymerization was stopped by addition of an aqueous 0.3 mass % ammonia solution in methanol to the reaction system. The reaction mixture solution was diluted with dichloromethane. The diluted mixture was washed with a 0.6 mol/L hydrochloric acid solution three times, and then with distilled water three times. After the washing, the organic phase was evaporated to dryness by an evaporator, and was vacuum-dried. The dried residue was dialyzed repeatedly through a cellulose semipermeable membrane with a methanol solvent to remove monomeric compounds to obtain the intended block copolymer. The copolymer was identified by NMR and GPC: Mn=21500, Mw/Mn=1.38, and polymerization ratio A:B=200:28.

The obtained block copolymer was hydrolyzed in a mixture solution of methanol and sodium hydroxide for 10 hours to obtain a hydrolyzed block copolymer 100%-hydrolyzed to a sodium salt. The compound was identified by NMR and GPC.

Synthesis of Block Copolymer-2

Synthesis of Tri-Block Copolymer Constituted of Isobutyl Vinyl Ether and $CH_2$=$CHOCH_2CH_2OPhPh$ (IBVE-r-VEEtPhPh: Block A), 2-Methoxyethyl Vinyl Ether (MOVE: Block B), and Ethyl 4-(2-Vinyloxy)ethoxybenzoate (Block C)

A glass container having a three-way stopcock was purged with nitrogen, and was heated in a nitrogen atmosphere to 250° C. to eliminate adsorbed water. The system was brought to room temperature. Thereto, were added 6 mmol of IBVE, 6 mmol of VEEtPhPh, 16 mL of ethyl acetate, 0.1 mmol of 1-isobutoxyethyl acetate, and 11 mL of toluene. The reaction system was cooled to 0° C. Thereto 0.2 mmol of ethylaluminum sesquichloride (an equimolar mixture of diethylaluminum chloride and ethylaluminum dichloride) was added to initiate polymerization. The molecular weight of the growing polymer was monitored at prescribed time intervals by molecular sieve column chromatography (GPC) to detect completion of the polymerization of block A.

Thereto 24 mmol of MOVE as the block-B component was added to continue polymerization. The completion of the polymerization of block B was confirmed by monitoring with GPC. Thereto a solution of 10 mmol of the block-C component in toluene was added, and polymerization was continued. After 20 hours, the polymerization was stopped by addition of an aqueous 0.3 mass % ammonia solution in methanol to the reaction system. The reaction mixture solution was diluted with dichloromethane. The diluted mixture was washed with a 0.6M hydrochloric acid solution three times, and then with distilled water three times. After the washing, the organic phase was evaporated to dryness by an evaporator, and was vacuum-dried. The dried residue was dialyzed repeatedly through a cellulose semipermeable membrane with a methanol solvent to remove monomeric compounds to obtain the intended tri-block copolymer. The copolymer was identified by NMR and GPC: Mn=36500, Mw/Mn=1.31, and polymerization ratio A:B:C=100:200:23. Polymerization ratio of the two monomers in Block A was 1:1. The obtained block copolymer was hydrolyzed in a mixture solution of methanol and sodium hydroxide to obtain a hydrolyzed tri-block copolymer having the block C 100%-hydrolyzed to a sodium salt form. The compound was identified by NMR and GPC.

Synthesis of Block Copolymer 3

A tri-block copolymer was synthesized in the same manner as in synthesis of block copolymer 2 except that the monomer of block B in synthesis of block copolymer 2 was changed to (2-(2-methoxyethyl)ethyl vinyl ether. Mn=37500, Mw/Mn=1.38, Polymerization ratio A:B:C=105:190:22. The polymerization ratio of the two monomers in block A was 1:1.

Synthesis of Block Copolymer 4

A tri-block copolymer was synthesized in the same manner as in synthesis of block copolymer 2 except that the monomer of block A in the synthesis of block copolymer 2 was changed to 2-ethoxyethoxy vinyl ether, and the monomer of block B in the synthesis of block copolymer 2 was changed to (2-(2- methoxyethyl)ethyl vinyl ether. Mn=33500, Mw/Mn=1.33, Polymerization ratio A:B:C-105:170:20

Synthesis of Block Copolymer 5

Synthesis of Tri-Block Copolymer, Poly[TolOVE-b-MOEOVE-b-VEEtPhCOOEt], constituted of 2-(4-Methylphenoxy)ethyl Vinyl Ether (TolOVE: Block A), Diethylene Glycol Methyl Vinyl Ether (MOEOVE: Block B), and Ethyl 4-(2-Vinyloxy) ethoxybenzoate (VEEtPhCOOEt: Block C)

(The above symbol "b" denotes a block polymer.)

A glass container having a three-way stopcock was purged with nitrogen, and was heated in a nitrogen atmosphere to 250° C. to eliminate adsorbed water. The system was brought to room temperature. Thereto, were added 5.0 mmol of 2-(4-methylphenoxy)ethyl vinyl ether (TolOVE), 16 mmol of dioxane, 0.05 mmol of 1-isobutoxyethyl acetate, and 11 mL of toluene. The reaction system was cooled to 0° C. Thereto 0.2 mmol of ethylaluminum sesquichloride (an equimolar mixture of diethylaluminum chloride and ethylaluminum dichloride) was added to initiate polymerization. The molecular weight of the growing polymer was monitored at prescribed intervals by molecular sieve column chromatography (GPC) to detect completion of the polymerization of block A.

Thereto 4.4 mmol of MOEOVE as the block B component was added to continue polymerization. The completion of the polymerization of block B was confirmed by monitoring with GPC. Thereto 5.0 mmol of ethyl 4-(2-vinyloxy)ethoxybenzoate was added as the block-C component to continue polymerization. After 3 hours, the polymerization was stopped by addition of an aqueous 0.3 mass % ammonia solution in methanol to the reaction system. The reaction mixture solution was diluted with dichloromethane. The diluted mixture was washed with a 0.6 mol/L hydrochloric acid solution three times, and then with distilled water three times. After the washing, the organic phase was evaporated to dryness by an evaporator, and was vacuum-dried. The dried residue was dialyzed repeatedly through a cellulose semipermeable membrane with a methanol solvent to remove monomeric compounds to obtain the intended tri-block copolymer. The copolymer was identified by NMR and GPC: Mn=26000, Mw/Mn=1.17, and polymerization ratio A:B:C=100:90:10.

A portion of 28 weight parts respectively of block copolymer-1, block copolymer-2, block copolymer-3, and block copolymer-5 was dispersed in 400 weight parts of pure water. To the respective dispersions, was added 48 weight parts of a dispersion of particulate gold in toluene (trade name: Perfect Gold, produced by Alback E S K.K.; gold content: 30 wt %, average particle diameter: 6 nm), and the mixture was dispersed by an ultrasonic dispersing machine. From the dispersions, coarse particulate matter was removed by a 2-μm membrane filter to prepare gold particle dispersions. The dispersions containing the block copolymers-1, 2, 3, and 5 were named dispersion-1, dispersion-2, dispersion-3, and dispersion-4 respectively. Dispersions-1, 2, 3, and 4 were all in a deep yellow color, and had an average particle diameter respectively of 129 nm, 134 nm, 154 nm, and 110 nm by particle size measurement with a particle size tester DLS7000 (manufactured by Ohtuka Denshi K.K.), having a dispersability index 0.089, 0.121, 0.078, and 0.070, respectively.

All of the dispersions were found to contain particulate gold of an average particle diameter of 18 nm by observation of the dispersion spread on a silicon base plate by a scanning electron microscopy. Each of dispersion-1, dispersion-2, dispersion-3, and dispersion-4 were estimated to contain microspheres enclosing plural primary gold particles. The microsphere states of dispersion-1, dispersion-2, dispersion-3, and dispersion-4 were actually observed by cryo-transfer TEM.

Separately, ink compositions were prepared by adding 65 mass parts respectively of the dispersion-1, dispersion-2, dispersion-3, and dispersion-4 to a mixture of 6 mass parts of glycerin and 12 mass parts of ethylene glycol. The obtained ink compositions were sealed in Teflon® containers and stored at 60° C. for two months. Then the dispersion stability was evaluated by visual observation of presence of sediment or precipitate. In any of dispersion-1, dispersion-2, dispersion-3, and dispersion-4, neither sediment nor precipitate was observed after the two-month storage.

A portion of 28 weight parts respectively of block copolymer-1, block copolymer-2, block copolymer-4, and block copolymer-5 was dispersed in 400 weight parts of pure water. To the respective dispersions, was added 14 weight parts of a dispersion of C60 fullerene in toluene, and the mixture was dispersed by an ultrasonic dispersing machine. From the dispersions, coarse particulate matter was removed by a 2-μm membrane filter to prepare dispersions. The dispersions containing the copolymers 1, 2, 4 and 5 were named dispersion-5, dispersion-6, dispersion-7, and dispersion-8, respectively. The particles in dispersions-5, 6, 7, and 8 had an average particle diameter respectively of 145 nm, 167 nm, 139 nm, and 129 nm by particle size measurement with a particle size tester DLS7000 (manufactured by Ohtuka Denshi K.K.), having a dispersability index 0.099, 0.131, 0.071, and 0.065. The micelle particles formed without the fullerene had an average particle diameter respectively of 46 nm, 55 nm, 45 nm, and 42 nm, having dispersability index respectively of 0.109, 0.089, 0.086, and 0.070. Dispersion-7 comprising block copolymer-4, when cooled to 0° C., caused separation of the fullerene (Block-A causes phase inversion to become hydrophilic at 20° C. or lower, resulting in collapse of the micelle). In consideration of this separation of fullerene and the diameter of several nanometers of the fullerene, the fullerene was estimated to be enclosed in the block copolymer in a micro sphere state.

Example 2

Ink compositions were prepared by adding 65 weight parts respectively of the dispersion-1, dispersion-2, and dispersion-3 prepared in Example 1 to a mixture of 6 weight parts of glycerin and 12 weight parts of ethylene glycol. The obtained ink compositions were filled respectively in an ink tank of a BJ printer, PIXUS 990i (manufactured by Canon K.K.). Printing was conducted with the ink compositions on a plain paper sheet. As the results, characters of a deep yellow color were printed with an excellent print quality. The printed characters were not blurred at all by pouring of water.

Example 3

Black liquid compositions were prepared by use of fine particulate silver having average particle diameter of 15 nm produced by a gas evaporation method and block copolymer-3 and block copolymer-5 in the same manner as in Example 1. With these black liquid compositions, inkjet ink compositions were prepared in the same manner as in Example 1. The obtained ink compositions were filled respectively in an ink tank of a BJ printer PIXUS 990i (manufactured by Canon K.K.) Printing was conducted with the ink compositions on a plain paper sheet. As the results, characters of a black color were printed with an excellent print quality. The printed characters were not blurred at all by pouring of water.

Comparative Example 1

A composition containing fine particulate gold dispersion in toluene was prepared in the same manner as in Example 1 except that the block copolymer in Example 1 was replaced by a 1:1 mixture of cetylammonium bromide and dodecyl tetraethylene glycol ether. To 65 weight parts of this composition, were added 6 weight parts of glycerin and 12 weight parts of ethylene glycol. As the result, deep yellow precipitate was formed.

Comparative Example 2

An inkjet ink was prepared in the same manner as in Example 1 except that the block copolymer in Example 1 was changed to a random copolymer (1:1) of styrene-sodium acrylate (Mn=14000, Mw/Mn=1.78). The obtained ink was filled in an ink tank of a BJ printer PIXUS990i (manufactured by Canon K.K.). Printing was conducted with the ink on a plain paper sheet. As the results, the printing was hardly conducted, with bluffed printed characters.

Example 4

Ink compositions were prepared from 65 weight parts respectively of the dispersion-5, dispersion-6, dispersion-7, and dispersion-8 prepared in Example 1 by addition of a mixture of 6 weight parts of glycerin and 12 weight parts of ethylene glycol. The obtained ink compositions were filled respectively in an ink tank of a BJ printer PIXUS 990i (manufactured by Canon K.K.). Straight lines were recorded in 0.3 mm in breadth and 1 cm in length on a silicon substrate. As the results, an excellent pattern was recorded with any of the compositions. Separately, recording was conducted in the same manner as above on a PET film by use of dispersion-5, dispersion-6, dispersion-7, and dispersion-8. An excellent pattern was recorded also on the PET film.

Example 5

The recorded matter made in Example 4 with dispersion-7 on the PET film was cooled by cooling the base plate to 5° C. to cause phase inversion to convert the block A to be hydrophilic to destroy the enclosure state. The recorded matter was left in that state for 5 hours, and further left standing at room temperature for 60 hours. The recorded matter was cut by a microtome, and was examined by scanning electron microscopy. It was found that the fullerene deposited with the maximum height of 360 nm and the deposit was surrounded by the polymer from outside.

Example 6

Dispersion compositions were prepared with tetrathiophene, a well-known p-type conductive oligothiophene, and block copolymer-4 or block copolymer-5 in the same manner as in Example 1. Recording was conduced with the compositions on a PET film in the same manner as in Example 4. As the results, excellent patterns were recorded.

Comparative Example 3

A composition was prepared in the same manner as in Example 1 except that the block copolymer was changed to a 1:1 mixture of cetylammonium bromide and dodecyl tetraethylene glycol ether, and fullerene employed in Example 1 was dispersed therein. To 65 weight parts of this composition, were added 6 weight parts of glycerin and 12 weight parts of ethylene glycol. As the results, precipitate came to be formed.

Comparative Example 4

An inkjet ink was prepared in the same manner as in Example 6 except that the block copolymer in Example 6 was changed to a random copolymer (1:1) of styrene-sodium acrylate (Mn=12000, Mw/Mn=1.91). This ink was tested for recording of lines in the same manner as Example 6. However, the line could not be recorded.

Example 7

Formation of Wiring Pattern

The ink compositions prepared by use of dispersion-2, 3, and 4 were filled respectively in an ink tank of a BJ printer PIXUS 990i (thermal system, manufactured by Canon K.K.). Line patterns were printed with the above ink compositions in a layer thickness of 5 μm and a line breadth of 120 μm at prescribed intervals on a polyimide film (Step A) The polyimide film used as the substrate in this Example had been preliminarily treated by spraying an aqueous 5 mass % polyacrylic acid solution of pH 2 and subsequent drying to be made stimulation-responsive (Step B). After the printing, the printed matter was heat-treated at 150° C. for 30 minutes, and at 210° C. for 60 minutes to decompose and vaporize the contained block copolymer.

The printed wiring patterns were evaluated for (1) variation of the line breadth, (2) line intervals, and (3) specific resistance. The evaluation standards are shown below.

(1) Variation of line breadth
   Good: Less than 5% for line breadth of 120 μm
   Fair: Less than 20% for line breadth of 120 μm
   Poor: 20% or more for line breadth of 120 μm (2) Line Interval
   Good: No overlapping by blurring between adjacent wiring lines at line interval of 60 μm or more
   Fair: No overlapping by blurring between adjacent wiring lines at line intervals of 80 μm or more
   Poor: Partial overlapping by blurring between adjacent lines at line intervals of 120 μm or more (3) Specific Resistance
   The specific resistance was derived by measuring the circuit resistance and the layer thickness.

(Evaluation Results)

(a) Variation of line breadth:
   "Good" for any of dispersions-2, 3 and 4

(b) Line Interval:
   "Good" for any of dispersions-2, 3 and 4

(c) Specific Resistance:
   Resistance of wiring pattern was $3 \times 10^{-4}$ Ωcm for any of dispersions-2, 3 and 4

Example 8

Black liquid compositions 77 and black liquid composition-8 were prepared in a similar manner as in Example 7 by use of a dispersion in toluene of fine particulate silver having average particle diameter of 15 nm produced by a gas evaporation method and block copolymer-3, and block copolymer-4 synthesized in Example 7, respectively. With these black liquid compositions, inkjet ink compositions were prepared. The obtained ink compositions were filled respectively in an ink tank of a BJ printer PIXUS 990i (manufactured by Canon K.K.). With the printer, line patterns were printed in a layer thickness of 5 μm and a line breadth of 120 μm at a prescribed intervals with the ink compositions on a polyimide film. Other conditions for the pattern formation were the same as in Example 7.

The printed wiring patterns were evaluated for (1) variation of the line breadth, (2) line intervals, and (3) specific resistance. The evaluation standards were the same as in Example 7.

(Evaluation Results)

(a) Variation of Line Breadth:
"Good" for black liquid compositions-7 and 8

(b) Line Interval:
"Good" for black liquid compositions-7 and 8

(c) Specific Resistance:
Specific resistances of wiring pattern were $2.6 \times 10^{-5}$ Ωcm for black liquid compositions-7 and 8.

Comparative Example 5

An inkjet ink was prepared in the same manner as in Example 7 except that the block copolymer in Example 7 was changed to a random copolymer (1:1) of styrene-sodium acrylate (Mn=14000, Mw/Mn=1.78). The obtained ink was filled in an ink tank of a BJ printer PIXUS 990i (manufactured by Canon K.K.). With the printer, line patterns were printed in a layer thickness of 5 μm and line breadth of 120 μm at a prescribed intervals with the ink compositions on a polyimide film. Other conditions for the pattern formation were the same as in Example 7. As the results, the printed wiring patterns were not satisfactory, with bluffing in most parts of the printed images.

Example 9

A black liquid composition was prepared in the same manner as in Example 1 with fine particulate silver having average particle diameter of 15 nm produced by a gas evaporation method and block copolymer-5. From the black liquid composition, coarse particulate matter was removed by a 2-μm membrane filter to obtain silver fine particle dispersion (hereinafter referred to as dispersion-10). Dispersion-10 was subjected to particle size measurement with a particle size tester DLS7000 (Ohtsuka Denshi K.K.): The average particle diameter was 125 nm, and dispersability index was 0.087.

An ink composition was prepared by adding 6 weight parts of glycerin, and 12 weight parts of ethylene glycol to 65 weight parts of dispersion-10.

Figure 2A:
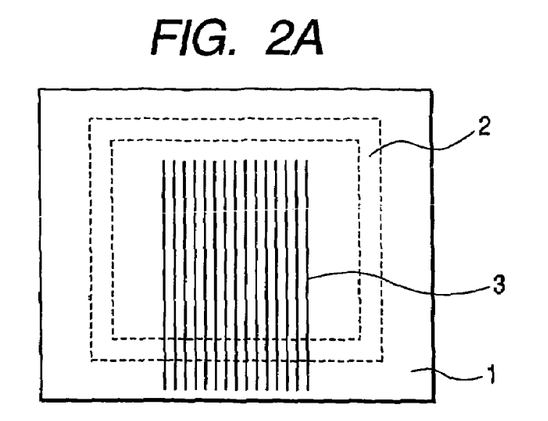
FIGS. 2A, 2B, and 2C are schematic drawings showing steps of formation of a matrix wiring pattern by the process for electroconductive pattern formation of the present invention.
Figure 2B:
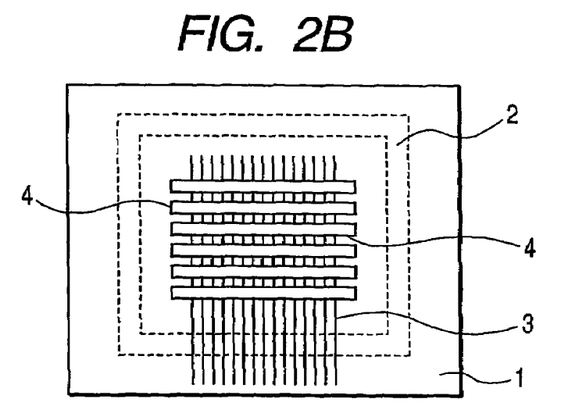
Figure 2C:
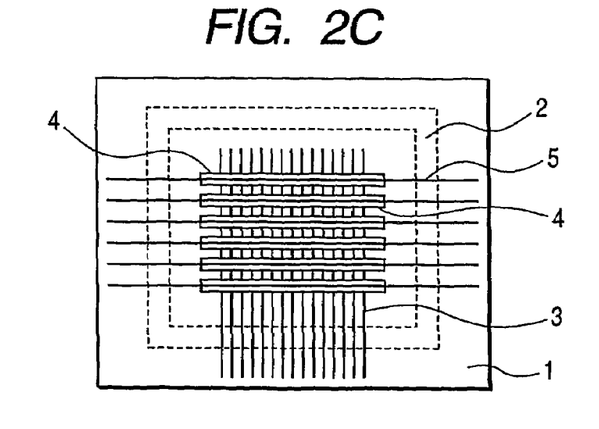

A process of formation of a matrix wiring pattern according to the pattern formation method of the present invention is explained below by reference to FIGS. 2A to 2C. FIGS. 2A to 2C are plan views for explaining a process for forming a matrix wiring pattern.

In FIGS. 2A to 2C, the numerals denote the following: 1, a substrate; 2, a position for setting a vacuum frame; 3, column wiring; 4, an insulation layer; and 5, line wiring. A part of the column wiring crosses the outer frame adhesion region.

The steps of the pattern formation are shown below. In this example, the sintering was conducted by a belt furnace.

Firstly as shown in FIG. 2A, column wiring 3 was formed on a glass substrate. Specifically, the ink composition prepared with the above dispersion-10 was filled in an ink tank of a BJ printer PIXUS 990i (thermal system, Canon K.K.), and ink droplets were applied to print the column wiring of 90 μm in breadth (Step A, FIG. 2B). Between the element electrodes 2 and 3, an aqueous 0.5 mass % solution of polyacrylic acid at pH 2 was sprayed and dried preliminarily to make the substrate to be stimulative (Step B).

Then, heat treatment was conducted in two steps, at 150° C. for 30 minutes and at 210° C. for 60 minutes, to decompose and vaporize the contained block copolymer to obtain column wiring 3 (Step C).

Insulation layer 4 was formed as shown in FIG. 2B by screen printing. The paste material employed was a glass paste composed of lead oxide as the main component, a glass binder, and a resin. A layer formed by printing was sintered at 400° C. for 10 minutes. In this example, the step of the printing with the glass paste and the sintering was repeated four times to form a laminated insulation layer.

Finally, line wirings 5 were formed on insulation layer 4 with a silver paste in the same manner as formation of column wiring 3. Through the above steps, a matrix wiring was completed which has a column wiring stripe and a line wiring stripe crossing perpendicularly with interposition of insulation layer 4. In this example, the substrate having the above wiring was sintered further at 480° C. for 10 minutes three times.

The matrix wiring pattern formed above had excellent properties, not causing line-disconnection or short circuit between adjacent wiring lines.

Comparative Example 6

An inkjet ink was prepared in the same manner as in Example 9 except that the block copolymer in Example 9 was changed to a random copolymer (1:1) of styrene-sodium acrylate (Mn=14000, Mw/Mn=1.78). A matrix wiring was formed with this ink in the same manner as in Example 9.

The matrix wiring thus formed was found to cause locally line-disconnection or short circuit between the adjacent wiring lines.

This application claims priority from Japanese Patent Application Nos. 2004-139050 filed May 7, 2004, 2004-139051 filed May 7, 2004 and 2005-034989 filed Feb. 10, 2005, which are hereby incorporated by reference herein.

The invention claimed is:

1. An image-forming method comprising:
   forming noble metal particles in a microsphere state by gas evaporation;
   a step A comprising applying an ink composition on a substrate, wherein the ink composition comprises (i) the noble metal particles in a microsphere state, (ii) an amphiphilic block copolymer having a repeating unit structure of a polyalkenyl ether, and (iii) a solvent, wherein the noble metal particles in a micro sphere state are enclosed in the amphiphilic block copolymer before applying the ink composition, and wherein the noble metal particles in a microsphere state have an average particle diameter of not more than 20 nm;
   a step B comprising stimulating the ink composition to destroy the enclosure of noble metal particles in a microsphere state by an amphiphilic block copolymer after step A; and
   a step C comprising treating the substrate on which a circuit pattern was fixed, by heat or light, to decompose and vaporize the block copolymer after step B to form a wiring pattern on the substrate.

2. The image-forming method according to claim 1, wherein the stimulation comprises cooling the substrate or changing the pH of the ink composition.

3. The image-forming method according to claim 1, wherein the noble metal particles in a microsphere state are composed of silver.

* * * * *